United States Patent
Narahashi et al.

(10) Patent No.: US 8,357,443 B2
(45) Date of Patent: *Jan. 22, 2013

(54) LAMINATE INCLUDING WATER SOLUBLE RELEASE LAYER FOR PRODUCING CIRCUIT BOARD AND METHOD OF PRODUCING CIRCUIT BOARD

(75) Inventors: Hirohisa Narahashi, Kanagawa (JP); Shigeo Nakamura, Kanagawa (JP); Tadahiko Yokota, Kanagawa (JP)

(73) Assignee: Ajinomoto Co., Inc., Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 12/551,802

(22) Filed: Sep. 1, 2009

(65) Prior Publication Data

US 2010/0044078 A1    Feb. 25, 2010

Related U.S. Application Data

(63) Continuation of application No. PCT/JP2008/053462, filed on Feb. 28, 2008.

(30) Foreign Application Priority Data

Mar. 1, 2007  (JP) ................................ 2007-052055
Mar. 1, 2007  (JP) ................................ 2007-052060
Aug. 22, 2007  (JP) ................................ 2007-216342

(51) Int. Cl.
*B32B 9/00* (2006.01)
*B32B 33/00* (2006.01)
*B32B 17/10* (2006.01)
*B32B 27/08* (2006.01)
*G11B 11/105* (2006.01)
*G11B 5/64* (2006.01)
*C09J 7/02* (2006.01)
*H05K 1/00* (2006.01)
*H05K 1/03* (2006.01)
*B29C 53/82* (2006.01)

(52) U.S. Cl. ..................... 428/41.8; 428/40.1; 428/40.9; 428/41.1; 428/332; 428/334; 428/335; 428/336; 428/337; 428/339; 174/250; 174/255; 156/155; 156/247; 156/249; 156/307.7

(58) Field of Classification Search ............... 428/40.1, 428/40.9, 41.1, 41.8, 221, 332, 334, 335, 428/336, 337, 339; 156/155, 247, 249, 307.7; 174/250, 255

See application file for complete search history.

(56) References Cited

U.S. PATENT DOCUMENTS

| | | | |
|---|---|---|---|
| 6,238,841 B1 * | 5/2001 | Morigaki | 430/280.1 |
| 6,702,916 B2 * | 3/2004 | Smith | 156/230 |
| 2002/0136843 A1 | 9/2002 | Chopra et al. | |
| 2003/0064223 A1 * | 4/2003 | Simmons et al. | 428/375 |
| 2003/0209697 A1 * | 11/2003 | Orsbon et al. | 252/500 |
| 2004/0101787 A1 * | 5/2004 | Naito et al. | 430/325 |
| 2006/0286395 A1 * | 12/2006 | Goto et al. | 428/480 |

FOREIGN PATENT DOCUMENTS

| | | |
|---|---|---|
| JP | 8-21776 | 3/1996 |
| JP | 9-296156 | 11/1997 |
| JP | 2000-319386 | 11/2000 |
| JP | 2002-12667 | 1/2002 |
| JP | 2002-324969 | 11/2002 |
| JP | 2003-95947 | 4/2003 |
| JP | 2004-230729 | 8/2004 |
| JP | 2005-56269 | 3/2005 |
| JP | 2005-311202 | 11/2005 |
| JP | 2006-37083 | 2/2006 |
| JP | 2006-228919 | 8/2006 |

OTHER PUBLICATIONS

"FR406 Prepreg MSDS", Isola, Feb. 2009, http://www.isola-group.com/images/file/FR406PrepregMSDSFinal20090202.pdf.*
U.S. Appl. No. 12/869,926, filed Aug. 27, 2010, Narahashi, et al.

* cited by examiner

*Primary Examiner* — Callie Shosho
*Assistant Examiner* — Nicholas Kokkinos
(74) *Attorney, Agent, or Firm* — Oblon, Spivak, McClelland, Maier & Neustadt, L.L.P.

(57) ABSTRACT

Producing a circuit board, by laminating, on a substrate, an adhesive film with a metal film, which comprises a water-soluble polymer release layer, a metal film layer and a curable resin composition layer, which are formed in this order on a support layer, and has a release property enabling detachment of said water-soluble polymer release layer from the support layer after curing of the curable resin composition layer, such that the curable resin composition layer contacts the substrate; curing the curable resin composition layer; detaching the support layer, and removing the water-soluble polymer release layer present on the metal film layer by dissolving the release layer in an aqueous solution, efficiently forms an insulating layer and a metal film layer superior in adhesiveness to the insulating layer and in uniformity.

18 Claims, No Drawings

LAMINATE INCLUDING WATER SOLUBLE RELEASE LAYER FOR PRODUCING CIRCUIT BOARD AND METHOD OF PRODUCING CIRCUIT BOARD

CROSS REFERENCES TO RELATED APPLICATIONS

This application is a continuation of International Patent Application No. PCT/JP2008/053462, filed on Feb. 28, 2008, and claims priority to Japanese Patent Application No. 2007-052055, filed on Mar. 1, 2007, Japanese Patent Application No. 2007-052060, filed on Mar. 1, 2007, and Japanese Patent Application No. 2007-216342, filed on Aug. 22, 2007, all of which are incorporated herein by reference in their entireties.

BACKGROUND OF THE INVENTION

1. Field of the Invention

The present invention relates to methods of making a circuit board. More particularly, the present relates to methods of making circuit board, including forming a metal film layer and an insulating layer by the use of an adhesive film with a metal film. The present invention further relates to adhesive films with a metal film, which are preferably used for the production of the aforementioned circuit board.

2. Discussion of the Background

Circuit boards such as multi-layer printed wiring boards, flexible printed wiring boards, and the like, which are widely used for various electronic devices, are desired to have thin layers and permit micro wiring of circuits so as to provide compact electronic devices having high functions. A known example of the production method thereof is a semi-additive method including laminating a curable resin composition using an adhesive film on an inner layer circuit board, curing the curable resin composition to form an insulating layer, roughening the insulating layer with an oxidant such as alkaline potassium permanganate solution and the like, forming a plating seed layer on the crude surface by electroless plating, and forming a conductive layer by electroplating. This method requires an anchor effect between the conductive layer and the insulating layer by roughening the surface of the insulating layer with an oxidant (forming concaves and convexes on the surface) as mentioned above, so as to confer high adhesion strength to the conductive layer. However, the method is associated with problems in that the seed layer of the anchor part resists removal of unnecessary plating seed layer by etching during formation of circuits, and etching under the conditions capable of sufficiently removing the seed layer of the anchor part noticeably dissolves the wiring patterns, thus preventing micro wiring.

To solve these problems, transfer of a metal film layer to be a plating seed layer onto an adherend (transferred body) using a transfer film has been tried. For example, JP-A-2004-230729 and JP-A-2002-324969 disclose a method for preparing a transfer film wherein a metal film layer is formed on a support via a release layer by vapor deposition and the like, transferring the metal film layer of the transfer film onto the surface of a resin composition layer (insulating layer) on the substrate or the surface of a prepreg, and forming a conductive layer by plating and the like on the transcribed metal film layer. The method of JP-A-2004-230729 is a method using a transfer film including, as a release layer, fluororesin, polyolefin resin or polyvinyl alcohol resin, and the method of JP-A-2002-324969 is a method using a transfer film including, as a release layer, an adhesive containing an adhesive resin such as acrylic resin, melamine resin. On the other hand, JP-A-9-296156 discloses an adhesive film obtained by directly forming a metal film layer on a support by vapor deposition and the like, and forming a resin composition layer thereon.

SUMMARY OF THE INVENTION

However, in the methods of JP-A-2004-230729 and JP-A-2002-324969, a transfer film is adhered to an adherend via an adhesive, requiring high adhesiveness between the adhesive and the metal film to achieve good metal film transferability, and transfer to a surface of an adherend having relatively low adhesiveness (resin composition layer on the substrate, prepreg etc.) is generally difficult. Adhesion to a metal film layer can be improved by curing a resin composition layer and a prepreg during transfer. However, when the present inventors tried transfer of a copper film to a resin composition layer using a transfer film including a poly(ethylene terephthalate) (PET) film with a fluororesin release layer described in JP-A-2004-230729, the release property of the PET film from the copper film adhered to the cured resin composition layer was poor and uniform transfer of the copper film was difficult. In addition, the present inventors tried transfer of a copper film on a resin composition layer by the use of a PET film with an acrylic resin release layer and PET film with a melamine resin release layer described in JP-A-2002-324969. However, the release property of the PET film from the copper film adhered to the cured resin composition layer was poor, and uniform transfer of the copper film was difficult. In JP-A-9-296156, moreover, in an adhesive film, formation or transfer of a metal film layer before curing a resin composition layer was tried. However, wrinkles, damage and the like are developed in the metal film layer, and a uniform metal film layer is difficult to form. In addition, use of a support layer without a release layer also causes difficulty in transfer of a metal film to a resin composition layer after curing of the resin composition layer.

Accordingly, it is one object of the present invention to provide novel methods of making a circuit board.

It is another object of the present invention to provide novel methods of making a circuit board, which are capable of efficiently forming an insulating layer and a metal film layer superior in adhesiveness to the insulating layer and uniformity.

It is another object of the present invention to provide novel adhesive films with a metal film which are useful in such a method.

These and other objects, which will become apparent during the following detailed description, have been achieved by the inventors' formation of an adhesive film having a layer constitution of support layer/release layer/metal film layer/curable resin composition layer, and further employed, as a release layer, a water-soluble polymer layer having release property enabling detachment between support layer and release layer after a curing step of the curable resin composition layer. They have found that a metal film layer having uniform property and an insulating layer to be its primer (curable resin composition layer after curing) can be integrally formed on a substrate by laminating the film on the substrate, curing a curable resin composition layer, detaching a support layer from a release layer, and removing the release layer remaining on the metal film layer after detachment by dissolving the release layer in an aqueous solution, which resulted in the completion of the present invention.

That is, the present invention provides:

(1) A method of producing a circuit board comprising a step of laminating, on a substrate, an adhesive film with a metal film, which comprises a water-soluble polymer release layer, a metal film layer and a curable resin composition layer, which are formed in this order on a support layer, and has release property enabling detachment of the aforementioned water-soluble polymer release layer between the release layer and the support layer after a curing step (to be mentioned later) of the curable resin composition layer, such that the curable resin composition layer contacts the substrate, a step of curing the curable resin composition layer, a step of detaching the support layer, and a step of removing the water-soluble polymer release layer present on the metal film layer by dissolving the release layer in an aqueous solution.

(2) The method of the above-mentioned (1), further comprising a step of forming a conductive layer on the metal film layer after the step of removing the water-soluble polymer release layer present on the metal film layer.

(3) The method of the above-mentioned (1) or (2), wherein the water-soluble polymer release layer is a water-soluble cellulose release layer.

(4) The method of the above-mentioned (3), wherein the water-soluble cellulose release layer is formed from one or more kinds selected from the group consisting of hydroxypropyl methylcellulose phthalate, hydroxypropyl methylcellulose acetate succinate and hydroxypropyl methylcellulose acetate phthalate.

(5) An adhesive film with a metal film comprising a water-soluble polymer release layer, a metal film layer and a curable resin composition layer, which are formed in this order on a support layer, and having release property enabling detachment of the aforementioned water-soluble polymer release layer between the support layer and the release layer after curing the curable resin composition layer.

(6) The adhesive film with a metal film of the above-mentioned (5), wherein the water-soluble polymer release layer is formed from one or more kinds selected from a water-soluble cellulose resin, a water-soluble acrylic resin and a water-soluble polyester resin.

(7) The adhesive film with a metal film of the above-mentioned (5), wherein the water-soluble polymer release layer is formed from a water-soluble cellulose resin.

(8) The adhesive film with a metal film of the above-mentioned (6) or (7), wherein the water-soluble cellulose resin is one or more kinds selected from the group consisting of hydroxypropyl methylcellulose phthalate, hydroxypropyl methylcellulose acetate succinate and hydroxypropyl methylcellulose acetate phthalate.

(9) The adhesive film with a metal film of the above-mentioned (6), wherein the water-soluble polyester resin is a water-soluble polyester having a sulfo group or a salt thereof and/or a carboxyl group or a salt thereof, and the water-soluble acrylic resin is a water-soluble acrylic resin having a carboxyl group or a salt thereof.

(10) The adhesive film with a metal film of the above-mentioned (5), wherein the support layer is a plastic film.

(11) The adhesive film with a metal film of the above-mentioned (5), wherein the support layer is a poly(ethylene terephthalate) film.

(12) The adhesive film with a metal film of the above-mentioned (5), wherein the metal film layer has one or more layers comprised of metal(s) selected from the group consisting of chrome, nickel, titanium, nickel chrome alloy, aluminum, gold, silver and copper.

(13) The adhesive film with a metal film of the above-mentioned (5), wherein the metal film layer is formed from copper.

(14) The adhesive film with a metal film of the above-mentioned (5), wherein the metal film layer comprises a copper layer, and a chrome layer, nickel chrome alloy layer or titanium layer, which are formed in this order on the water-soluble polymer release layer.

(15) The adhesive film with a metal film of the above-mentioned (5), wherein the metal film layer is formed by a vapor deposition method and/or a sputtering method.

(16) The adhesive film with a metal film of the above-mentioned (5), wherein the curable resin composition comprises an epoxy resin.

(17) The adhesive film with a metal film of the above-mentioned (5), wherein the curable resin composition comprises an epoxy resin, a thermoplastic resin and a curing agent.

(18) The adhesive film with a metal film of the above-mentioned (5), wherein the curable resin composition comprises an epoxy resin, a thermoplastic resin and a cyanate ester resin.

(19) The adhesive film with a metal film of any of the above-mentioned (16) to (18), wherein the curable resin composition further comprises an inorganic filler.

(20) The adhesive film with a metal film of the above-mentioned (5), wherein the curable resin composition layer is a prepreg of a reinforcement fiber sheet impregnated with a curable resin composition.

(21) The adhesive film with a metal film of any of the above-mentioned (5) to (20), wherein the support layer has a layer thickness of 10 μm to 70 μm.

(22) The adhesive film with a metal film of any of the above-mentioned (5) to (20), wherein the water-soluble polymer release layer has a layer thickness of 0.1 μm to 20 μm.

(23) The adhesive film with a metal film of any of the above-mentioned (5) to (20), wherein the water-soluble polymer release layer has a layer thickness of 0.2 μm to 5 μm.

(24) The adhesive film with a metal film of any of the above-mentioned (5) to (20), wherein the metal film layer has a layer thickness of 50 nm to 5000 nm.

(25) The adhesive film with a metal film of any of the above-mentioned (5) to (20), wherein the metal film layer has a layer thickness of 50 nm to 1000 nm.

(26) A circuit board produced by the use of the adhesive film with a metal film of any of the above-mentioned (5) to (25).

Since, in the production method of a circuit board of the present invention, an adhesive film with a metal film is laminated on a substrate, a curable resin composition layer is cured to be integrated with the substrate, detaching is performed between a release layer—a support layer rather than a metal film layer—a release layer, and then the release layer on the metal film layer is removed by dissolution, a dynamics load acting on a metal film layer during such transfer step is small, a metal film layer can be transferred uniformly, and a laminate structure of an insulating layer (curable resin composition layer after curing) and a metal film layer (insulating layer/metal film layer) can be easily formed on a substrate. Therefore, a metal film layer having high adhesiveness and high property uniformity can be formed on the surface without the need for roughening the surface of an insulating layer with an oxidant such as alkaline potassium permanganate solution and the like. Thus, etching for circuit formation can be performed under milder conditions, which in turn provides a superior effect on micro wiring on circuit boards such as multi-layer printed wiring board, flexible printed wiring board and the like.

DETAILED DESCRIPTION OF THE PREFERRED EMBODIMENTS

The present invention is explained in detail in the following by referring to a preferable embodiment thereof.

The production method of a circuit board of the present invention is mainly characterized by comprising a step of laminating, on a substrate, an adhesive film with a metal film, which comprises a water-soluble polymer release layer, a metal film layer and a curable resin composition layer such that the curable resin composition layer contacts the substrate, a step of curing the curable resin composition layer, a step of detaching the support layer, and a step of removing the water-soluble polymer release layer present on the metal film layer by dissolving the release layer in an aqueous solution.

The adhesive film with a metal film to be used in the present invention is, as mentioned above, a laminate of a water-soluble polymer release layer, a metal film layer and a curable resin composition layer, which are formed in this order on a support layer.

Support Layer.

In the adhesive film with a metal film to be used in the present invention, the support layer is a film or a sheet-like product having a self supporting ability and a plastic film is preferably used. As the plastic film, poly(ethylene terephthalate) film, poly(ethylene naphthalate) film, polyimide film, polyamideimide film, polyamide film, polytetrafluoroethylene film, polycarbonate film, and the like can be mentioned, and poly(ethylene terephthalate) film and poly(ethylene naphthalate) film are preferable. Of these, poly(ethylene terephthalate) film is particularly preferable in view of the low cost. The surface of a support film to be in contact with a water-soluble polymer release layer may be subjected to a release treatment with a mold release agent such as silicone mold release, alkyd resin mold release, fluorine mold release and the like, a surface treatment such as corona treatment and the like. In addition, the surface of a support film which is not in contact with a water-soluble polymer may also be subjected to a surface treatment such as mat treatment, corona treatment and the like.

In addition, the layer thickness of the support layer is generally 10 µm to 70 µm, preferably 15 µm to 70 µm. When the layer thickness is too small, the layer is poor in the handling property and tends to show decreased release property of the support layer and decreased smoothability of the metal film layer. When the layer thickness is too high, the layer is disadvantageous in the cost and is not practical.

Water-Soluble Polymer Release Layer.

As a water-soluble polymer release layer, one having release property enabling detachment between a support layer and a release layer after curing a curable resin composition layer is used. As a water-soluble polymer constituting the water-soluble polymer release layer, specifically, a water-soluble cellulose resin, a water-soluble polyester resin, a water-soluble acrylic resin, and the like are used. A water-soluble cellulose resin and a water-soluble polyester resin are more preferable, and a water-soluble cellulose resin is particularly preferable. While a water-soluble polymer is generally used alone as a water-soluble polymer release layer, a mixture of two or more kinds of water-soluble polymers can also be used. In addition, while a water-soluble polymer release layer is generally formed as a single layer, it may have a multi-layer structure consisting of two or more layers comprising different water-soluble polymers.

Water-Soluble Cellulose Resin.

The "water-soluble cellulose resin" used in the present invention refers to a cellulose derivative that has received a treatment to confer water solubility to cellulose. Preferred are cellulose ether, cellulose ether ester and the like.

The cellulose ether is an ether formed by converting one or more hydroxyl groups present in one or more anhydrous glucose repeat units of a cellulose polymer, so as to provide one or more ether linkage groups in the cellulose polymer. Example of the ether linkage group is generally an alkyl group (carbon number 1 to 4) optionally substituted by one or more kinds of substituents selected from a hydroxyl group, a carboxyl group, an alkoxy group (carbon number 1 to 4) and a hydroxyalkoxy group (carbon number 1 to 4). Specific examples include a hydroxyalkyl group (carbon number 1 to 4) such as 2-hydroxyethyl, 2-hydroxypropyl, 3-hydroxypropyl and the like; an alkoxy (carbon number 1 to 4) alkyl group (carbon number 1 to 4) such as 2-methoxyethyl, 3-methoxypropyl, 2-methoxypropyl, 2-ethoxyethyl and the like; a hydroxyalkoxy (carbon number 1 to 4) alkyl group (carbon number 1 to 4) such as 2-(2-hydroxyethoxy)ethyl or 2-(2-hydroxypropoxy)propyl and the like, a carboxyalkyl group (carbon number 1 to 4) such as carboxymethyl, etc. and the like. The linkage group in a polymer molecule may be a single kind or plurality of kinds. In other words, it may be a cellulose ether having a single kind of ether linkage group or a cellulose ether having plurality of kinds of ether linkage groups.

Specific examples of the cellulose ether include methylcellulose, hydroxyethylcellulose, hydroxypropylcellulose, hydroxypropyl methylcellulose, hydroxybutyl methylcellulose, hydroxyethyl ethylcellulose, carboxymethylcellulose and water-soluble salts thereof (e.g., alkali metal salt such as sodium salt etc.).

While the average number of moles of an ether group substituted per unit glucose ring in cellulose ether is not particularly limited, about 1 to 6 is preferable. In addition, the molecular weight of cellulose ether is preferably about 20000 to 60000 in weight average molecular weight.

On the other hand, cellulose ether ester is an ester formed between one or more hydroxyl groups present in cellulose, and one or more preferable organic acids or a reactive derivative thereof, based on which an ester linkage group is formed in cellulose ether. The "cellulose ether" here is as mentioned above, the "organic acid" includes aliphatic or aromatic carboxylic acid (carbon number 2 to 8), and the aliphatic carboxylic acid may be non-cyclic (branched or non-branched) or cyclic, and saturated or unsaturated. Specific examples of the aliphatic carboxylic acid include substituted or unsubstituted acyclic dicarboxylic acid such as acetic acid, propionic acid, butyric acid, valeric acid, malonic acid, succinic acid, glutaric acid, fumaric acid, maleic acid and the like; acyclic hydroxy-substituted monocarboxylic acid such as glycol acid, lactic acid and the like; acyclic hydroxy-substituted di- or tri-carboxylic acid such as malic acid, tartaric acid, citric acid, etc. and the like. In addition, as the aromatic carboxylic acid, arylcarboxylic acid having a carbon number of not more than 14 is preferable, and arylcarboxylic acid containing an aryl group such as phenyl, naphthyl group having one or more carboxyl groups (e.g., 1, 2 or 3 carboxyl groups) and the like are particularly preferable. The aryl group may be substituted by the same or different, one or more (e.g., 1, 2 or 3) groups selected from hydroxy, alkoxy (e.g., methoxy) having a carbon number of 1 to 4 and sulfonyl. Preferable examples of the arylcarboxylic acid include phthalic acid, isophthalic acid, terephthalic acid, trimellitic acid (1,2,4-benzenetricarboxylic acid) and the like.

When organic acid has one or more carboxyl groups, preferably, only one carboxyl group of the acid forms an ester linkage with cellulose ether. For example, in the case of hydroxypropyl methylcellulose succinate, one carboxyl group of each succinate group forms an ester linkage group with cellulose, and the other carboxyl group is present as a free acid. The "ester linkage group" can be formed by a reaction of cellulose or cellulose ether with the preferable organic acid or a reactive derivative thereof mentioned above. Preferable reactive derivative includes, for example, acid anhydride such as phthalic anhydride and the like.

The ester linkage group in a polymer molecule may be of a single kind or plural kinds. In other words, it may be cellulose ether ester having a single kind of ester linkage group, or cellulose ether ester having a plurality of kinds of ester linkage groups. For example, hydroxypropyl methylcellulose acetatesuccinate is a mixed ester of hydroxypropyl methylcellulose having both succinate group and acetate group.

Preferable cellulose ether ester is ester of hydroxypropyl methylcellulose or hydroxypropylcellulose. Specific examples include hydroxypropyl methylcellulose acetate, hydroxypropyl methylcellulose succinate, hydroxypropyl methylcellulose acetate succinate, hydroxypropyl methylcellulose phthalate, hydroxypropyl methylcellulose trimeritate, hydroxypropyl methylcellulose acetate phthalate, hydroxypropyl methylcellulose acetate trimeritate, hydroxypropylcellulose acetate phthalate, hydroxypropylcellulose butyrate phthalate, hydroxypropylcellulose acetate phthalate succinate, hydroxypropylcellulose acetate trimeritate succinate and the like. One or more kinds thereof can be used.

Of these, hydroxypropyl methylcellulose phthalate, hydroxypropyl methylcellulose acetate succinate and hydroxypropyl methylcellulose acetate phthalate are preferable.

Metolose

While the average number of moles of the ester group substituted per unit glucose ring in cellulose ether ester is not particularly limited, for example, it is preferably about 0.5 to 2 mol. In addition, the molecular weight of cellulose ether ester is not particularly limited, preferably about 20000 to 60000 in weight average molecular weight.

Production methods of cellulose ether and cellulose ether ester are known, and these can be obtained using naturally-occurring cellulose (pulp) as a starting material and reacting an etherification reagent or esterification reagent according to a conventional method. In the present invention, commercially available products can be used, such as "HP-55", "HP-50" (both hydroxypropyl methylcellulose phthalates) or "METOLOSE" (hydroxypropyl methylcellulose) manufactured by Shin-Etsu Chemical Co., Ltd. and the like.

Water-Soluble Polyester Resin.

The "water-soluble polyester resin" in the present invention is a polyester resin comprising a substantially linear polymer, wherein a hydrophilic group is introduced into a molecule or molecule terminal, which is synthesized by usual polycondensation reaction using polyvalent carboxylic acid or an ester forming derivative thereof, and polyvalent alcohol or an ester-forming derivative thereof as main starting materials. Here, examples of the hydrophilic group include organic acid groups such as a sulfo group, a carboxyl group, a phosphoric acid group and the like or a salt thereof and the like, with preference given to a sulfo group or a salt thereof, and a carboxyl group or a salt thereof. As the water-soluble polyester resin, one having a sulfo group or a salt thereof and/or a carboxyl group or a salt thereof is particularly preferable.

Representative examples of polyvalent carboxylic acid component in the polyester resin include terephthalic acid, isophthalic acid, phthalic acid, phthalic anhydride, 2,6-naphthalenedicarboxylic acid, 1,4-cyclohexanedicarboxylic acid, adipic acid and the like. These may be used alone or two or more kinds thereof may be used in combination. Together with the above-mentioned various compounds, moreover, a small amount of hydroxycarboxylic acid such as p-hydroxybenzoic acid and the like, maleic acid, fumaric acid or unsaturated carboxylic acid such as itaconic acid and the like may be used in combination.

Representative examples of the polyvalent alcohol component in the polyester resin include ethylene glycol, 1,4-butanediol, neopentylglycol, diethylene glycol, dipropyleneglycol, 1,6-hexaneglycol, 1,4-cyclohexanemethanol, xylyleneglycol, dimethylolpropionic acid, glycerol, trimethylolpropane or poly(tetramethyleneoxide)glycol and the like. These may be used alone or two or more kinds thereof may be used in combination.

A hydrophilic group can be introduced into a molecule or molecule terminal of the polyester resin by a conventional known method. It is preferable to copolymerize an ester-forming compound containing a hydrophilic group (e.g., aromatic carboxylic acid compound, hydroxyl compound etc.).

For example, when a sulfonate group is to be introduced, it is preferable to copolymerize one or more kinds selected from 5-(sodium sulfonato)isophthalic acid, 5-(ammonium sulfonato)isophthalic acid, 4-(sodium sulfonato)isophthalic acid, 4-(ammonium methylsulfonato) isophthalic acid, 2-(sodium sulfonato)terephthalic acid, 5-(potassium sulfonato) isophthalic acid, 4-(potassium sulfonato)isophthalic acid, 2-(potassium sulfonato)terephthalic acid and the like.

In addition, when a carboxyl group is to be introduced, for example, it is preferable to copolymerize one or more kinds selected from trimellitic acid anhydride, trimellitic acid, pyromellitic anhydride, pyromellitic acid, trimesic acid, cyclobutanetetracarboxylic acid, dimethylolpropionic acid and the like. Carboxylate group can be introduced into the molecule by neutralizing with an amino compound, ammonia or alkali metal salt and the like after the copolymerization reaction.

While the molecular weight of the water-soluble polyester resin is not particularly limited, it is preferably about 10000 to 40000 in weight average molecular weight. When the weight average molecular weight is less than 10000, layer-forming ability tends to decrease, and when it exceeds 40000, dissolution property tends to decrease.

In the present invention, the water-soluble polyester resin may be a commercially available product. Examples thereof include "PLAS COAT Z-561" (weight average molecular weight: about 27000) and "PLAS COAT Z-565" (weight average molecular weight: about 25000) manufactured by GOO Chemical Co., Ltd., and the like.

Water-Soluble Acrylic Resin.

The "water-soluble acrylic resin" in the present invention is an acrylic resin that disperses or dissolves in water since it contains a carboxyl group-containing monomer as an essential component.

More preferably, the acrylic resin is an acrylic polymer containing a carboxyl group-containing monomer and (meth)acrylic acid ester as essential monomer components and, where necessary, other unsaturated monomer as a monomer component.

In the above-mentioned monomer components, examples of the carboxyl group-containing monomer include (meth)acrylic acid, maleic acid, fumaric acid, crotonic acid, itaconic acid, citraconic acid, maleic anhydride, maleic acid monomethyl, maleic acid monobutyl, itaconic acid monomethyl, itaconic acid monobutyl and the like. One or more kinds of these can be used. Of these, (meth)acrylic acid is preferable.

In addition, examples of the (meth)acrylic acid ester include methacrylic acid alkyl ester wherein the carbon number of alkyl is 1 to 18, such as methyl(meth)acrylate, ethyl (meth)acrylate, n-propyl(meth)acrylate, n-butyl (meth)acrylate, isobutyl(meth)acrylate, n-pentyl (meth)acrylate, n-hexyl(meth)acrylate, n-heptyl (meth)acrylate, n-octyl (meth)acrylate, 2-ethylhexyl (meth)acrylate, nonyl(meth)acrylate, decyl(meth)acrylate, dodecyl(meth)acrylate, stearyl (meth)acrylate and the like. One or more kinds of these can be used.

In addition, examples of other unsaturated monomer include an aromatic alkenyl compound, a vinyl cyanide compound, a conjugated diene compound, a halogen-containing unsaturated compound, a hydroxyl-containing monomer and the like. Examples of the aromatic alkenyl compound include styrene, α-methylstyrene, p-methylstyrene, p-methoxystyrene and the like. Examples of the vinyl cyanide compound include acrylonitrile, methacrylonitrile and the like. Examples of the conjugated diene compound include butadiene, isoprene and the like. Examples of the halogen-containing unsaturated compound include vinyl chloride, vinylidene chloride, perfluoroethylene, perfluoropropylene, vinylidene fluoride and the like. Examples of the hydroxyl-containing monomer include 2-hydroxyethyl (meth)acrylate, 2-hydroxypropyl(meth)acrylate, 3-hydroxypropyl(meth)acrylate, 2-hydroxybutyl(meth)acrylate, 4-hydroxybutylacrylate, 4-hydroxybutylmethacrylate, α-hydroxymethylethyl(meth)acrylate and the like. One or more kinds of these can be used.

In the present invention, the water-soluble polymer release layer can be preferably formed by a method including coating and drying a coating solution containing a water-soluble polymer onto a support, as mentioned below. When a water-soluble acrylic resin is used, the coating solution can be used in both forms of an emulsion and an aqueous solution.

When a water-soluble acrylic resin is used in the form of an emulsion, a core-shell type emulsion is preferable. In a core-shell type emulsion, it is important that a carboxyl group be present in the shell of core-shell particles. Thus, the shell is constituted with an acrylic resin comprising a carboxyl group-containing monomer and (meth)acrylic acid ester.

A dispersion product (emulsion) of such core-shell particles may be a commercially available product, such as JONCRYL7600 (Tg: about 35° C.), 7630A (Tg: about 53° C.), 538J (Tg: about 66° C.), 352D (Tg: about 56° C.) (all manufactured by BASF Japan Ltd.) and the like.

When the water-soluble acrylic resin is used in the form of an aqueous solution, it is important that the acrylic resin comprises a carboxyl group-containing monomer and (meth)acrylic acid ester, and has a comparatively low molecular weight. Thus, the weight average molecular weight is preferably 1000 to 50000. When the weight average molecular weight is less than 1000, the film forming ability tends to decrease. When the weight average molecular weight exceeds 50000, the release property of the support after curing tends to decrease due to high adhesion to the support.

An aqueous solution of such a water-soluble acrylic resin may be a commercially available product, such as JONCRYL354J (manufactured by BASF Japan Ltd.) and the like.

When an emulsion and an aqueous solution of a water-soluble acrylic resin are compared, the emulsion is easily formed into a thin film since it has a high molecular weight. Therefore, an emulsion of a water-soluble acrylic resin is preferable.

The layer thickness of the water-soluble polymer release layer is generally 0.1 μm to 20 μm, preferably 0.2 μm to 10 μm, more preferably 0.2 to 5 μm. Here, the "layer thickness" means the thickness of the water-soluble polymer release layer when the release layer is a single layer, and the total thickness when the release layer has multi-layers. When the layer thickness is too small, the releaseability of the support layer may decrease, and when the layer thickness is too high, inconveniences such as crack and scratch in a metal film layer and the like may occur during thermal curing of a curable resin composition layer due to the difference in the thermal expansion ratio between the metal film layer and the release layer.

Metal Film Layer.

In the adhesive film with a metal film, which is to be used in the present invention, as the metal film layer, any kind of metal such as a single metal of gold, platinum, silver, copper, cobalt, chrome, nickel, titanium, tungsten, iron, tin, indium and the like, and a solid solution (alloy) of appropriate two or more kinds of metals and the like can be used. Of these, chrome, nickel, titanium, nickel-chrome alloy, copper-nickel alloy, copper-titanium alloy, gold, silver and copper are preferable, chrome, nickel, titanium, nickel-chrome alloy, gold, silver and copper are more preferable, and copper is particularly preferable from the aspects of cost, general versatility that permits application of a vapor deposition method and a sputtering method, electric conductivity and the like. In addition, the metal film layer may be a single layer or a laminate of two or more layers. For example, in a system that fears thermal degradation (decomposition) of a resin due to diffusion of a copper layer into a curable resin composition layer and the like during thermosetting of a curable resin composition layer, a chrome layer, a nickel-chrome alloy layer or a titanium layer can be formed on the copper layer as necessary. That is, a copper layer is formed on a water-soluble polymer on a release layer, and thereafter, a chrome layer, a nickel and chrome layer or a titanium layer can be further formed.

While the layer thickness of the metal film layer is not particularly limited, it is generally preferably 50 nm to 3000 nm, more preferably 100 nm to 3000 nm, particularly preferably 100 nm to 1000 nm. When the layer thickness is too small, a metal film layer may develop unevenness due to flaw and the like during electroplating operation in the production of circuit boards, and inconvenience may occur during formation of a conductive layer. On the other hand, when the layer thickness is too high, formation of a metal film by a sputtering method and/or a vapor deposition method takes a long time, which is economically unpreferable. When a two-layer structure of copper layer/chrome layer, nickel-chrome alloy layer or titanium layer as mentioned above is employed, the thickness of the whole layer is the same as the above-mentioned, and the thickness of chrome layer, nickel-chrome layer or titanium layer is preferably 5 nm to 100 nm, more preferably 5 nm to 50 nm, particularly preferably 5 nm to 30 nm, most preferably 5 nm to 20 nm.

Curable Resin Composition Layer.

In an adhesive film with a metal film to be used in the present invention, the curable resin composition to be used for the curable resin composition layer may be any without particular limitation as long as a cured product thereof has sufficient hardness and sufficient insulation property. For example, a composition of a curable resin such as an epoxy resin, a cyanate ester resin, a phenol resin, a bismaleimide-triazine resin, a polyimide resin, an acrylic resin, a vinylbenzyl resin and the like, added with at least a curing agent therefor can be used. As the curable resin, a composition containing an epoxy resin is preferable and, for example, a composition containing at least (a) an epoxy resin, (b) a thermoplastic resin and (c) a curing agent is preferable.

(a) Examples of the epoxy resin include bisphenol A type epoxy resin, biphenyl type epoxy resin, naphthol type epoxy resin, naphthalene type epoxy resin, bisphenol F type epoxy resin, phosphorus-containing epoxy resin, bisphenol S type epoxy resin, alicyclic epoxy resin, linear aliphatic epoxy resin, phenol novolac type epoxy resin, cresol novolac type epoxy resin, bisphenol A novolac type epoxy resin, epoxy resin having a butadiene structure, diglycidyl ether based on bisphenol, naphthalenediol diglycidyl etherified product, glycidyl etherified product of phenols, and diglycidyl etherified product of alcohols, and alkyl substituted form of these epoxy resins, halide and hydrogenation products and the like. Any one kind of these epoxy resins may be used, or two or more kinds thereof may be used in a mixture.

From among these, bisphenol A type epoxy resin, naphthol type epoxy resin, naphthalene type epoxy resin, biphenyl type epoxy resin and epoxy resin having a butadiene structure are preferable epoxy resins from the aspects of heat resistance, insulation reliability and adhesion to a metal film. Specific examples include liquid bisphenol A type epoxy resin ("EPIKOTE828EL" manufactured by Japan Epoxy Resin Co., Ltd.), naphthalene type bifunctional epoxy resin ("HP4032" and "HP4032D" manufactured by DIC Corporation), naphthalene type tetrafunctional epoxy resin ("HP4700" manufactured by DIC Corporation), naphthol type epoxy resin ("ESN-475V" manufactured by Tohto Kasei Co., Ltd.), epoxy resin having butadiene structure ("PB-3600" manufactured by DICEL Chemical Industries, Ltd.), epoxy resin having biphenyl structure ("NC3000H" and "NC3000L" manufactured by Nippon Kayaku Co., Ltd., "YX4000" manufactured by Japan Epoxy Resin Co., Ltd.), and the like.

(b) The thermoplastic resin is added to impart appropriate flexibility to a composition after curing and, for example, phenoxy resin, polyvinyl acetal resin, polyimide, polyamideimide, polyethersulfone, polysulfone and the like can be used. Any one kind of these may be used alone or two or more kinds thereof may be used in combination. The thermoplastic resin is preferably added in a proportion of 0.5 to 60 mass %, more preferably 3 to 50 mass %, relative to the nonvolatile component of curable resin composition as 100 mass %. When the proportion of addition of the thermoplastic resin is less than 0.5 mass %, a uniform curable resin composition layer cannot be formed easily since the viscosity of the resin composition is low. When it exceeds 60 mass %, embedding into the wiring pattern on the substrate tends to be difficult since the viscosity of the resin composition is too high.

Specific examples of the phenoxy resin include FX280 and FX293 manufactured by Tohto Kasei Co., Ltd., YX8100, YL6954, YL7482, YL6553, YL7290, YL7213 and YL6974 manufactured by Japan Epoxy Resin Co., Ltd. and the like.

The polyvinyl acetal resin is preferably a polyvinyl butyral resin. Specific examples of the polyvinyl acetal resin include DENKA BUTYRAL 4000-2, 5000-A, 6000-C and 6000-EP manufactured by DENKI KAGAKU KOGYO KABUSHIKI KAISHA, S-LEC BH series, BX series, KS series, BL series and BM series manufactured by SEKISUI CHEMICAL CO., LTD., and the like.

Specific examples of the polyimide include polyimides "RIKACOAT SN20" and "RIKACOAT PN20" manufactured by New Japan Chemical Co., Ltd. In addition, linear polyimide (described in JP-A-2006-37083) obtained by reacting bifunctional hydroxyl group terminal polybutadiene, diisocyanate compound and tetrabasic acid anhydride, modified polyimide such as polysiloxane skeleton-containing polyimide (described in JP-A-2002-12667, JP-A-2000-319386 etc., which are incorporated herein by reference in their entireties) and the like can be mentioned.

Specific examples of polyamideimide include polyamideimides "VYLOMAX HR11NN" and "VYLOMAX HR16NN" manufactured by Toyobo Co., Ltd. In addition, modified polyamideimide such as polysiloxane skeleton-containing polyamideimides "KS9100" and "KS9300" manufactured by Hitachi Chemical Co., Ltd. and the like can be mentioned.

Specific examples of polyethersulfone include polyethersulfone "PES5003P" manufactured by Sumitomo Chemical Co., Ltd. and the like.

Specific examples of polysulfone include polysulfones "P1700" and "P3500" manufactured by Solvay Advanced Polymers, LLC and the like.

(c) Examples of the curing agent include amine curing agent, guanidine curing agent, imidazole curing agent, phenol curing agent, naphthol curing agent, acid anhydride curing agent, and epoxy adducts thereof and microcapsulated ones, active ester curing agent, cyanate ester resin and the like. Of these, phenol curing agent, naphthol curing agent, active ester curing agent and cyanate ester resin is preferable. In the present invention, the curing agent may be one kind, or a combination of two or more kinds thereof.

Specific examples of the phenol curing agent and naphthol curing agent include MEH-7700, MEH-7810 and MEH-7851 (manufactured by Meiwa Plastic Industries, Ltd.), NHN, CBN and GPH (manufactured by Nippon Kayaku Co., Ltd.), SN170, SN180, SN190, SN475, SN485, SN495, SN375 and SN395 (manufactured by Tohto Kasei Co., Ltd.), LA7052, LA7054, LA3018 and LA1356 (manufactured by DIC Corporation) and the like. Specific examples of the active ester curing agent include EXB9460, EXB9451 and the like.

In addition, specific examples of the cyanate ester resin include bifunctional cyanate resins such as bisphenol A dicyanate, polyphenol cyanate (oligo(3-methylene-1,5-phenylene cyanate)), 4,4'-methylenebis(2,6-dimethylphenylcyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, bis (4-cyanatephenyl)ether and the like, multifunctional cyanate resin induced from phenol novolac, cresol novolac and the like, prepolymers wherein these cyanate resins are partly triazinized and the like. Examples of the commercially available cyanate ester resin include phenol novolac type multifunctional cyanate ester resin (PT30 manufactured by Lonza Japan Ltd., cyanate equivalent 124), prepolymer wherein bisphenol A dicyanate is partly triazinized into a trimer (BA230 manufactured by Lonza Japan Ltd., cyanate equivalent 232) and the like.

The mixing ratio of epoxy resin (a) and curing agent (c) when a phenol curing agent or a naphthol curing agent is used is preferably such that an equivalent of the phenolic hydroxyl group of the curing agent is 0.4 to 2.0, more preferably 0.5 to 1.0, relative to epoxy equivalent of 1 of the epoxy resin. When a cyanate ester resin is used, the ratio is such that a cyanate equivalent is 0.3 to 3.3, more preferably 0.5 to 2.0, relative to epoxy equivalent of 1. When the equivalent ratio of the reactive groups is outside this range, the mechanical strength and water resistance of the cured product tends to decrease.

The curable resin composition can further contain, in addition to curing agent (c), (d) a curing accelerator. Examples of such curing accelerator include imidazole compound, organic phosphine compound and the like. Specific examples include 2-methylimidazole, triphenylphosphine and the like. When curing accelerator (d) is to be used, it is preferably used within the range of 0.1 to 3.0 mass % relative to the epoxy resin. When a cyanate ester resin is used as an epoxy resin curing agent, an organic metal compound may be added, which is conventionally used as a curing catalyst in a system where an epoxy resin composition and a cyanate compound are used in combination, to shorten the curing time. Examples of the organic metal compound include organic copper compounds such as copper(II) acetylacetonate and the like, organic zinc compounds such as zinc(II) acetylacetonate and the like, organic cobalt compounds such as cobalt(II) acetylacetonate, cobalt(III) acetylacetonate, etc. and the like. The amount of the organic metal compound to be added is generally 10 to 500 ppm, preferably 25 to 200 ppm, based on the metal, relative to the cyanate ester resin.

In addition, the curable resin composition can contain (e) an inorganic filler for low thermal expansion of the composition after curing. Examples of the inorganic filler include silica, alumina, mica, mica, silicate, barium sulfate, magnesium hydroxide, titanium oxide and the like, preferably silica and alumina, particularly preferably silica. The inorganic filler preferably has an average particle size of not more than 3 μm, more preferably not more than 1.5 μm, from the aspect of insulation reliability. The content of the inorganic filler in the curable resin composition is preferably 20 to 60 mass %, more preferably 20 to 50 mass %, when the nonvolatile component in the curable resin composition is 100 mass %. When the content of the inorganic filler is less than 20 wt %, the thermal expansion rate-lowering effect tends be not sufficiently exhibited, and when the content of the inorganic filler exceeds 60 wt %, the mechanical strength of the cured product tends to decrease and the like.

The curable resin composition can contain other components as necessary. Examples of the other components include flame-retardants such as organic phosphorus flame-retardant, organic nitrogen-containing phosphorus compound, nitrogen compound, silicone flame-retardant, metal hydroxide and the like, fillers such as silicone powder, nylon powder, fluorine powder and the like, thickeners such as ORBEN, BENTON and the like, silicone, fluorine or polymer antifoaming agents or leveling agents, adherence imparting agents such as imidazole, thiazole, triazole, silane coupling agents and the like, colorants such as phthalocyanine blue, phthalocyanine green, iodine green, DISAZO YELLOW, carbon black, etc. and the like.

The curable resin composition layer may be a prepreg of a fiber reinforcement sheet impregnated with the aforementioned curable resin composition. As the fiber of the reinforcement sheet, those conventionally used as a fiber for prepreg such as glass cloth, aramid fiber etc. can be used. The prepreg can be formed by impregnating a reinforcement sheet with a curable resin composition by a hot-melt method or a solvent method and semi-curing by heating. The hot-melt method includes, without dissolving a resin composition in an organic solvent, once applying the resin composition to a coating paper showing good release property from the resin composition, and laminating the paper on a reinforcement sheet, or directly coating the reinforcement sheet with a die coater and the like to give a prepreg. The solvent method includes immersing a reinforcement sheet in a varnish obtained by dissolving a resin in an organic solvent to impregnate the reinforcement sheet with the varnish, and thereafter drying the reinforcement sheet.

In the adhesive film with a metal film to be used in the present invention, the thickness of the curable resin composition layer to be formed on a substrate varies depending on the thickness of a conductive layer of an inner layer circuit and the like. From the aspects of insulation reliability between layers and the like, it is preferably about 10 to 150 μm, more preferably 15 to 80 μm.

The production method of the adhesive film with a metal film to be used in the present invention is not particularly limited and, for example, a production method including sequentially forming a water-soluble polymer release layer, a metal film layer and a curable resin composition layer on a support layer, a production method including sequentially forming a water-soluble polymer release layer and a metal film layer on a support layer to give a metal film transfer film, forming a curable resin composition layer on a support to give an adhesive film, and laminating the transfer film and the adhesive film by adhering them such that the curable resin composition layer contacts the metal film layer under heating conditions and the like can be mentioned. The support of the adhesive film includes the aforementioned plastic film and the like. It is preferable to subject the surface on which a curable resin composition layer of the support is formed to a release treatment with a mold release agent such as a silicone mold release agent, alkyd resin mold release agent, fluorine mold release agent and the like.

In the preparation of the above-mentioned metal film transfer film, the method of forming a water-soluble polymer release layer on a support layer is not particularly limited, known lamination methods such as heat-press, heat-roll lamination, extrusion lamination, coating and drying of a coating solution and the like can be employed. A method including coating and drying a coating solution containing a water-soluble polymer is preferable, since it is convenient, it can easily form a layer having high property uniformity and the like.

In addition, a metal film layer is preferably formed by a sputtering method and/or vapor deposition method from the aspects of film performance and close adhesion to a curable resin composition layer.

On the other hand, the adhesive film can be formed by preparing a varnish of a solution or dispersion of a curable resin composition on one surface (surface subjected to a release treatment when it is applied) of a support, applying the varnish onto a metal film layer and drying the film. When the curable resin composition layer is a prepreg, the prepreg is laminated on the support by, for example, a vacuum lamination method.

For lamination of a transfer film and an adhesive film (prepreg), a transfer film and an adhesive film (prepreg) are superimposed such that a metal film layer of the transfer film and a curable resin composition layer of the adhesive film (prepreg) are faced to each other, and heat-pressed by a heat-press, a heat roll and the like. The heating temperature is preferably 60 to 140° C., more preferably 80 to 120° C. When the heating temperature is less than 60° C., sufficient adhesion tends to fail, and when the heating temperature exceeds 140° C., the resin unpreferably tends to outflow. The pressure-bonding pressure is preferably in the range of 1 to 11 kgf/cm$^2$ ($9.8 \times 10^4$ to $107.9 \times 10^4$ N/m$^2$), particularly preferably 2 to 7 kgf/cm$^2$ ($19.6 \times 10^4$ to $68.6 \times 10^4$ N/m$^2$). When the pressure-bonding pressure is less than 1 kgf/cm$^2$ ($9.8 \times 10^4$ N/m$^2$), the flowability of the resin composition becomes insufficient, sufficient adhesion to the metal film layer is not available, and voids tend to remain in the interface with the metal film layer on the transfer film. When the pressure-bonding pressure exceeds 11 kgf/cm$^2$ ($107.9 \times 10^4$ N/m$^2$), the outflow of the resin intensifies, and a predetermined film thickness unpreferably becomes difficult to retain.

The production method of the circuit board of the present invention includes at least the following steps (A) to (D).

(A) An adhesive film with a metal film, which is prepared as mentioned above, is laminated on a substrate such that a curable resin composition layer is in contact with a substrate.

(B) Then, the curable resin composition layer is cured. As a result, a curable resin composition layer of the adhesive film with a metal film and the substrate are adhered.

(C) Then, a support layer of the adhesive film with a metal film is detached. The support layer may be detached manually or mechanically detached using an automatic detaching apparatus.

(D) Then, the water-soluble polymer release layer present on the metal film layer after detaching the support layer is removed by dissolving the layer in an aqueous solution. As a result, a laminate structure of an insulating layer (curable resin composition layer after curing) and a metal film layer (insulating layer/metal film layer) can be formed on a substrate.

The "substrate" in the present invention is a concept including a glass epoxy substrate, a metal substrate, a polyester substrate, a polyimide substrate, a BT resin substrate, a thermosetting polyphenylene ether substrate and the like, and these substrates having a conductive layer formed by pattern processing (circuit formation) one surface or both surfaces thereof, which are used as intermediate products, i.e., what is called an "inner layer circuit board", on which an insulating layer and a conductive layer are formed for the production of circuit boards.

In addition, a "circuit board" in the present invention is not particularly limited as long as it has an insulating layer and a circuit-formed conductive layer, and various circuit boards such as a multi-layer printed wiring board, a flexible printed wiring board and the like can be mentioned.

For lamination of an adhesive film with a metal film on a substrate, the film is preferably laminated on the surface of the adherend by roll-bonding, press-bonding and the like, in view of workability and available uniform contact state. Particularly, lamination under reduced pressure by vacuum lamination method is preferable. In addition, the lamination method may be of a batch type or a continuous type with a roll.

The lamination conditions are bonding pressure generally within the range of 1 to 11 kgf/cm$^2$ ($9.8 \times 10^4$ to $107.9 \times 10^4$ N/m$^2$), and reduced air pressure of not more than 20 mmHg (26.7 hPa).

The vacuum lamination can be performed using a commercially available vacuum laminating machine. Examples of the commercially available vacuum laminating machine include a batch type vacuum pressurization laminating machine MVLP-500 manufactured by MEIKI CO., LTD., a vacuum applicator manufactured by Nichigo-Morton Co., Ltd., a vacuum pressurization laminating machine manufactured by MEIKI CO., LTD., a roll-type dry coater manufactured by Hitachi Industries Co., Ltd., a vacuum laminating machine manufactured by Hitachi AIC Inc. and the like.

The curing treatment of the curable resin composition layer is generally a thermal curing treatment. While the conditions therefor vary depending on the kind of the curable resin and the like, the curing temperature is generally 120-200° C., and the curing time is 15 to 90 minutes. Stepwise curing from comparatively low curing temperature to high curing temperature or curing while increasing the temperature is preferable for prevention of wrinkles on the surface of the insulating layer to be formed.

A support layer is detached after formation of the insulating layer by a curing treatment of the curable resin composition layer. When it is detached before the curing treatment, inconveniences such as insufficient transfer of the metal film layer, cracks in the metal film layer after curing of the curable resin composition, and the like easily occur. It is necessary to detach the support layer after curing treatment of the curable resin composition layer.

As an aqueous solution to be used for removing by dissolving a water-soluble polymer release layer on a metal film layer after a support layer is detached in the present invention, preferably, an alkaline aqueous solution obtained by dissolving sodium carbonate, sodium hydrogen carbonate, sodium hydroxide, potassium hydroxide and the like in water at a concentration of 0.5 to 10 wt % and the like can be used. The aqueous solution may contain alcohol such as methanol, ethanol, isopropyl alcohol and the like within the range free of problem during production of a circuit board and the like, though such addition is generally not necessary. The method of removal by dissolution is not particularly limited and, for example, a method including detaching a support layer, and immersing the substrate in an aqueous solution to allow removal by dissolution, a method including spraying an aqueous solution in a spray state or mist state to allow removal by dissolution and the like can be mentioned. The temperature of the aqueous solution is generally room temperature—about 80° C., and the treatment time of immersion in water, spraying and the like is generally 10 seconds to 10 minutes. As the alkaline aqueous solution, an alkali type developer solution for alkali development machine (e.g., 0.5 to 2 wt % aqueous sodium carbonate solution, 25° C. to 40° C.), a detaching solution for dry film detaching machine (e.g., 1 to 5 wt % aqueous sodium hydroxide solution, 40° C. to 60° C.), a swelling solution used in a desmear step (e.g., alkali aqueous solution containing sodium carbonate, sodium hydroxide and the like, 60° C. to 80° C.) and the like, which are used for production of circuit boards, can also be used.

Where necessary, an insulating layer formed on a substrate is perforated to form a via hole or a through hole. The perforation step may be performed from a support after lamination of an adhesion film with a metal film transfer, and curing treatment, or from water-soluble cellulose after support detachment, or from a metal film after removal of a water-soluble polymer release layer. Perforation can be performed, for example, by a known method using drilling, laser, plasma and the like, or a combination of these methods as necessary. Perforation by laser such as carbon dioxide gas laser, YAG laser and the like is a most general method. After the perforation step, smear present in the bottom of the via hole and the like is removed by a desmear step. The desmear step can be performed by a known method such as a dry method (e.g., plasma and the like), a wet method by an oxidant treatment using alkaline permanganate solution and the like, and the like.

After the above-mentioned steps (A) to (D), the metal film layer may be directly used as a conductive layer, or (E) a metal layer is further grown on a metal film layer by plating (electroless plating and/or electroplating) to form a conductive layer. While the metal layer by electroplating generally has the same metal species as the metal film layer, a metal layer of a different metal species can also be formed. In a preferable embodiment, for example, the metal film layer is a copper layer, or a laminate of a copper layer and a chrome layer, a nickel-chrome alloy layer or a titanium layer formed on the copper layer, a copper plating layer is formed on the copper layer to be the surface layer after transfer. In the present invention, the thickness of the electroplating layer varies depending on the thickness of the metal film layer and the design of a desired circuit board. It is generally 3 to 35 μm, preferably 5 to 30 µm. When a perforation step is performed, a conductive layer can be formed in a hole by a known method such as a combination of electroless plating and electroplating, direct plating and the like.

Other features of the invention will become apparent in the course of the following descriptions of exemplary embodiments which are given for illustration of the invention and are not intended to be limiting thereof.

EXAMPLES

In the following description, "part" means "parts by weight".

Example 1

Preparation of Metal Film Transfer Film

A 1:1 solution of methylethylketone (hereinafter to be abbreviated as MEK) and N,N-dimethylformamide (hereinafter to be abbreviated as DMF) having a hydroxypropyl methylcellulose phthalate ("HP-55" manufactured by Shin-Etsu Chemical Co., Ltd.) solid content of 10% was applied onto a 38 µm-thick poly(ethylene terephthalate) (hereinafter to be abbreviated as PET) film by a die coater, the solvent was removed by raising the temperature from room temperature to 140° C. at a temperature rise rate of 3° C./second in a hot-air drying oven, whereby a 1 µm hydroxypropyl methylcellulose phthalate layer was formed on the PET film. Then, a copper layer (500 nm) was formed on the hydroxypropyl cellulose phthalate layer by sputtering (E-400S, manufactured by Canon ANELVA Corporation) and a chrome layer (20 nm) was formed on the copper layer, whereby a film for metal film transfer having a 520 nm metal film layer was produced.

Preparation of Adhesive Film

Liquid bisphenol A type epoxy resin (epoxy equivalent 180, "EPIKOTE828EL" manufactured by Japan Epoxy Resin Co., Ltd.) (28 parts) and naphthalene type tetrafunctional epoxy resin (epoxy equivalent 163, "HP4700" manufactured by DIC Corporation) (28 parts) were dissolved by heating with stirring in a mixture of MEK (15 parts) and cyclohexanone (15 parts). Thereto were added MEK solution (110 parts) having a naphthol curing agent (hydroxyl group equivalent 215, "SN-485" manufactured by Tohto Kasei Co., Ltd.) solid content of 50%, a curing catalyst ("2E4MZ" manufactured by SHIKOKU CHEMICALS CORPORATION) (0.1 part), spherical silica (average particle size 0.5 µm, "SOC2" manufactured by Admatechs Company Limited) (70 parts), and ethanol and toluene (1:1) solution (30 parts) having a polyvinyl butyral resin ("KS-1" manufactured by SEKISUI CHEMICAL CO., LTD.) solid content of 15%, and the mixture was uniformly dispersed in a high-speed rotary mixer to give a resin varnish. The above-mentioned varnish was applied to a release layer of a 38 µm-thick release PET film (manufactured by TORAY ADVANCED FILM Co., "CERAPEELHP2") having an acrylic release resin by a die coater. The solvent was removed in a hot-air drying oven to give an adhesive film having a 40 µm-thick curable resin composition layer.

Preparation of Adhesive Film with Metal Film

The above-mentioned adhesive film and a transfer film were laminated at 90° C. such that the curable resin composition layer and the metal film transfer film were contacted and wound to give an adhesive film with a metal film.

Formation of Curable Resin Composition Layer on Circuit Board with Adhesive Film with Metal Film.

The copper layer of a glass epoxy substrate with a circuit formed by a 18 µm-thick copper layer was roughened by a treatment with CZ8100 (azole-copper complex, surface treating agent containing organic acid (manufactured by MEC COMPANY LTD.)). Then, a support on the adhesive film side of the adhesive film with a metal film prepared above was detached, and the adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below. Then, the curable resin composition layer was cured at 150° C. for 30 minutes, and further at 180° C. for 30 minutes to give an insulating layer (cured product layer). A PET film, which is a support layer of a film for metal film transfer, was detached from the insulating layer. The release property was good and the film was easily detached by hand. Thereafter, a hydroxypropyl methylcellulose phthalate layer was removed by immersing (with stirring) in 1% aqueous sodium carbonate solution at room temperature for 1 minute. The metal film layer was uniformly transferred, and abnormalities such as swelling between the resin and the metal film, wrinkles of the metal film and cracks of the metal film were not observed.

Formation of Copper Plating Layer.

A metal film layer was subjected to electro copper plating to form an about 30 µm-thick copper plating layer, whereby a multi-layer printed wiring board was produced.

Example 2

Preparation of Adhesive Film

Liquid bisphenol A type epoxy resin (828EL) (28 parts) and naphthalene type tetrafunctional epoxy resin (HP-4700) (28 parts) were dissolved by heating with stirring in a mixture of MEK (15 parts) and cyclohexanone (15 parts). Thereto were added a novolac resin, which is a phenol curing agent (phenolic hydroxyl group equivalent of solid 120, "LA7052" manufactured by DIC Corporation, MEK solution having a solid content of 60%) (50 parts), a phenoxy resin ("E1256" (manufactured by Japan Epoxy Resin Co., Ltd.), molecular weight 50000, MEK solution having a solid content of 40%) (20 parts), a curing catalyst (2E4MZ) (0.1 part), spherical silica (SOC2) (55 parts), polyvinyl butyral resin solution of Example 1 (30 parts) and epoxy resin having a butadiene structure (molecular weight 27000, "PB-3600" manufactured by DICEL Chemical Industries, Ltd.) (3 parts), and the mixture was uniformly dispersed in a high-speed rotary mixer to give a resin varnish. The above-mentioned varnish was applied to a 38 µm-thick PET film by a die coater. The solvent was removed in a hot-air drying oven to give an adhesive film having a 40 µm-thick curable resin composition layer.

Preparation of Adhesive Film with Metal Film.

The above-mentioned adhesive film and the metal film transfer film prepared in Example 1 were laminated at 90° C. such that the curable resin composition layer and the metal film layer were contacted and wound to give an adhesive film with a metal film.

Formation of Curable Resin Composition Layer on Circuit Board with Adhesive Film with Metal Film.

The copper layer of a glass epoxy substrate with a circuit formed by a 18 µm-thick copper layer was roughened by a treatment with CZ8100 (azole-copper complex, surface treating agent containing organic acid (manufactured by MEC COMPANY LTD.)). Then, a support on the adhesive film side of the adhesive film with a metal film prepared above was detached, and the adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below. Then, the curable resin composition layer was cured at 150° C. for 30 minutes, and further at 180° C. for 30 minutes to give an insulating layer (cured product layer). A PET, which is a support layer, was detached from the insulating layer. The release property was good and the film was easily detached by hand. Thereafter, the hydroxypropyl methylcellulose phthalate layer was removed by dissolving the layer in a 1% aqueous sodium carbonate solution. The metal film layer was uniformly transferred, and abnormalities such as swelling between the resin and the metal layer, wrinkles of the metal layer and cracks of the metal layer were not observed.
Formation of Copper Plating Layer.

A metal film layer was subjected to electric copper plating to form an about 30 μm-thick copper plating layer, whereby a multi-layer printed wiring board was produced.

Example 3

Preparation of Adhesive Film with Metal Film

A prepolymer of bisphenol A dicyanate (cyanate equivalent 232, "BA230S75" manufactured by Lonza Japan Ltd., MEK solution having a solid content of 75%) (30 parts), a phenol novolac type multifunctional cyanate ester resin (cyanate equivalent 124, "PT30" manufactured by Lonza Japan Ltd.) (10 parts), MEK solution (40 parts) having a naphthol type epoxy resin (epoxy equivalent 340, "ESN-475V" manufactured by Tohto Kasei Co., Ltd.) solid content of 65%, a liquid bisphenol A type epoxy resin (828EL) (5 parts), a phenoxy resin solution ("YP-70" manufactured by Tohto Kasei Co., Ltd., MEK and cyclohexanone (1:1) solution having a solid content of 40%) (15 parts), cobalt(II) acetylacetonate as a curing catalyst (manufactured by Tokyo Chemical Industry Co., Ltd., DMF solution having a solid content of 1%) (4 parts), and spherical silica (SOC2) (40 parts) were mixed, and the mixture was uniformly dispersed in a high-speed rotary mixer to give a resin varnish. The above-mentioned varnish was applied onto the metal film layer of the metal film transfer film produced in Example 1 by a die coater. The solvent was removed in a hot-air drying oven to give an adhesive film with a metal film, which has a 40 μm-thick curable resin composition layer.

In the same manner as in Example 2, a curable resin composition layer and a metal film layer were formed on a circuit board using an adhesive film with a metal film. In the same manner as in Example 2, hydroxypropyl methylcellulose phthalate layer was removed by dissolving the layer in a 1% aqueous sodium carbonate solution, and a copper plating layer was formed by electric copper plating, whereby a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

Example 4

Preparation of Modified Polyimide

G-3000 (bifunctional hydroxyl group terminal polybutadiene, number average molecular weight=5047 (GPC method), hydroxyl group equivalent=1798 g/eq., solid content 100 w %: manufactured by Nippon Soda Co., Ltd.) (50 g), Ipsol 150 (aromatic hydrocarbon mixed solvent: manufactured by IDEMITSU Petroleum Chemical) (23.5 g), and di-n-butyltin dilaurate (0.007 g) were mixed in a reaction vessel, and the mixture was uniformly dissolved. When the mixture became uniform, it was heated to 50° C., toluene-2,4-diisocyanate (isocyanate group equivalent=87.08 g/eq.) (4.8 g) was added with stirring, and the mixture was reacted for about 3 hours. Then, the reaction product was cooled to room temperature. Thereto were added benzophenonetetracarboxylic dianhydride (acid anhydride equivalent=161.1 g/eq.) (8.83 g), triethylenediamine (0.07 g) and ethylene glycol diacetate (manufactured by DICEL Chemical Industries, Ltd.) (74.09 g), the mixture was heated to 130° C. with stirring, and reacted for about 4 hours. At the time point when disappearance of NCO peak at 2250 $cm^{-1}$ was confirmed by FT-IR, toluene-2,4-diisocyanate (isocyanate group equivalent=87.08 g/eq.) (1.43 g) was added, and disappearance of NCO peak was confirmed by FT-IR while reacting with stirring at 130° C. for 2-6 hours. Taking confirmation of disappearance of NCO peak as the reaction end-point, the reaction mixture was cooled to room temperature and filtered through a 100 mesh fabric filter to give a modified polyimide resin.

property of modified polyimide resin: viscosity=7.0 Pa·s (25° C., E-type viscometer)
acid value=6.9 mg KOH/g
solid content=40 w %
number average molecular weight=19890
content of polybutadiene structure=50×100/(50+4.8+8.83+1.43)=76.9 mass %
Preparation of Adhesive Film.

The above-mentioned modified polyimide resin varnish (40 parts), a liquid bisphenol A type epoxy resin (828EL) (4 parts), a dicyclopentadiene-containing polyfunctional epoxy resin (epoxy equivalent 279, "HP-7200H" manufactured by DIC Corporation) (12 parts), a phenolnovolac resin (phenolic hydroxyl group equivalent of solid 120, "TD-2090" manufactured by DIC Corporation, MEK solution having a solid content of 60%) (8.5 parts), and spherical silica (SOC2) (10 parts) were mixed, and the mixture was uniformly dispersed in a high-speed rotary mixer to give a resin varnish. The above-mentioned varnish was applied to a 38 μm-thick PET film by a die coater. The solvent was removed in a hot-air drying oven to give an adhesive film having a 40 μm-thick curable resin composition layer.
Preparation of Adhesive Film with Metal Film.

The above-mentioned adhesive film and the metal film transfer film prepared in Example 1 were laminated at 90° C. such that the curable resin composition layer and the metal film layer were contacted and wound to give an adhesive film with a metal film.
Formation of Curable Resin Composition Layer on Circuit Board with Adhesive Film with Metal Film.

The copper layer of a glass epoxy substrate with a circuit formed by a 18 μm-thick copper layer was roughened by a treatment with CZ8100 (azole-copper complex, surface treating agent containing organic acid (manufactured by MEC COMPANY LTD.)). The adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below. Then, the curable resin composition layer was cured at 150° C. for 30 minutes, and further at 180° C. for 30 minutes to give an insulating layer (cured product layer). A PET film, which is a support layer, was detached from the insulating layer. The release property was good and the film was easily detached by hand. Thereafter, a hydroxypropyl methylcellulose phthalate layer was removed by immersing (with stirring) the layer in 1% aqueous sodium carbonate solution. The metal film layer was uniformly transferred, and abnormalities such as swelling between resin and metal film, wrinkles of metal film and crack of metal film were not observed.

Formation of Copper Plating Layer.

A metal film layer was subjected to electric copper plating to form an about 30 μm-thick copper plating layer, whereby a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

Example 5

In the same manner as in Example 1 except that a metal film layer of the film for metal film transfer consisted only of a copper layer (500 nm) (no chrome layer), a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

Example 6

In the same manner as in Example 1 except that a metal film layer of the film for metal film transfer consisted only of a copper layer (250 nm) (no chrome layer), a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

Example 7

Preparation of Metal Film Transfer Film

A 1:1 solution of methylethylketone (hereinafter to be abbreviated as MEK) and N,N-dimethylformamide (hereinafter to be abbreviated as DMF) having a water-soluble polyester resin, PLAS COAT Z-561 (manufactured by GOO Chemical Co., Ltd.) solid content of 2.5% was applied onto a 38 μm-thick poly(ethylene terephthalate) (hereinafter to be abbreviated as PET) film by a die coater, the solvent was removed by drying at room temperature to 120° C. for 15 minutes in a hot-air drying oven, whereby a 1 μm water-soluble polyester resin layer was formed on the PET film. Then, a copper layer (500 nm) was formed on the water-soluble acrylic resin layer by sputtering (E-400S, manufactured by Canon ANELVA Corporation) and a chrome layer (20 nm) was formed on the copper layer, whereby a film for metal film transfer having a 520 nm metal film layer was produced.

Preparation of Adhesive Film.

Liquid bisphenol A type epoxy resin (828EL) (28 parts) and naphthalene type tetrafunctional epoxy resin (HP-4700) (28 parts) were dissolved by heating with stirring in a mixture of MEK (15 parts) and cyclohexanone (15 parts). Thereto were added a novolac resin having a triazine structure, which is a phenol curing agent (phenolic hydroxyl group equivalent of solid 120, "LA7052" manufactured by DIC Corporation, MEK solution having a solid content of 60%) (50 parts), a phenoxy resin ("E1256" (manufactured by Japan Epoxy Resin Co., Ltd.), molecular weight 50000, MEK solution having a solid content of 40%) (20 parts), a curing catalyst (2E4MZ) (0.1 part), spherical silica (SOC2) (55 parts), polyvinyl butyral resin:solution (1:1 solution of ethanol and toluene having a solid content of "KS-1" manufactured by SEKISUI CHEMICAL CO., LTD. of 15%) (30 parts) and epoxy resin having a butadiene structure (molecular weight 27000, "PB-3600" manufactured by DICEL Chemical Industries, Ltd.) (3 parts), and the mixture was uniformly dispersed in a high-speed rotary mixer to give a resin varnish. The above-mentioned varnish was applied to a 38 μm-thick PET film by a die coater. The solvent was removed in a hot-air drying oven to give an adhesive film having a 40 μm-thick curable resin composition layer.

Preparation of Adhesive Film with Metal Film.

The above-mentioned adhesive film and the transfer film were laminated at 90° C. such that the curable resin composition layer and the metal film transfer film were contacted and wound to give an adhesive film with a metal film.

Formation of Curable Resin Composition Layer on Circuit Board with Adhesive Film with Metal Film.

The copper layer of a glass epoxy substrate with a circuit formed by a 18 μm-thick copper layer was roughened by a treatment with CZ8100 (azole-copper complex, surface treating agent containing organic acid (manufactured by MEC COMPANY LTD.)). The adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below, and pressing at pressure 7.54 kgf/cm$^2$ for 30 seconds. Then, the curable resin composition layer was cured at 150° C. for 30 minutes, and further at 180° C. for 30 minutes to give an insulating layer (cured product layer). A PET film, which is a support layer for a metal film transfer film, was detached from the insulating layer. The release property was good and the film was easily detached by hand. Thereafter, the water-soluble polyester layer was removed by dissolving the layer in 10% aqueous sodium hydroxide solution at 40° C. The metal film layer was uniformly transferred, and abnormalities such as swelling between the resin and the metal layer, wrinkles of the metal layer and cracks of the metal layer were not observed.

Formation of Copper Plating Layer.

A metal film layer was subjected to electric copper plating to form an about 30 μm-thick copper plating layer, whereby a multi-layer printed wiring board was produced.

Example 8

Preparation of Metal Film Transfer Film

A water-soluble acrylic resin, JONCRYL7600 (manufactured by BASF Japan Ltd., aqueous dispersion having a solid content of 47%) was applied onto a 38 µm-thick PET film by a die coater, the solvent was removed by drying at 120° C. for 15 minutes in a hot-air drying oven, whereby a 1 µm water-soluble acrylic resin layer was formed on the PET film. Then, a copper layer (500 nm) was formed on the water-soluble acrylic resin layer by sputtering (E-400S, manufactured by Canon ANELVA Corporation) and a chrome layer (20 nm) was formed on the copper layer, whereby a film for metal film transfer having a 520 nm metal film layer was produced.

Preparation of Adhesive Film with Metal Film.

The adhesive film prepared in Example 7 and the above-mentioned metal film transfer film were laminated at 90° C. such that the curable resin composition layer and the metal film transfer film layer were contacted and wound to give an adhesive film with a metal film.

Formation of Curable Resin Composition Layer on Circuit Board with Adhesive Film with Metal Film.

The copper layer of a glass epoxy substrate with a circuit formed by a 18 µm-thick copper layer was roughened by a treatment with CZ8100 (azole-copper complex, surface treating agent containing organic acid (manufactured by MEC COMPANY LTD.)). The adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below, and pressing at pressure 7.54 kgf/cm$^2$ for 30 seconds. Then, the curable resin composition layer was cured at 150° C. for 30 minutes, and further at 180° C. for 30 minutes to give an insulating layer (cured product layer). A PET film, which is a support layer, was detached from the insulating layer. The release property was good and the film was easily detached by hand. Thereafter, the water-soluble acrylic resin layer was removed by immersing (with stirring) the layer in 10% aqueous sodium hydroxide solution at 40° C. The metal film layer was uniformly transferred, and abnormalities such as swelling between the resin and the metal film, wrinkles of the metal film and cracks of the metal film were not observed.

Formation of Copper Plating Layer.

A metal film layer was subjected to electric copper plating to form an about 30 µm-thick copper plating layer, whereby a multi-layer printed wiring board was produced.

Example 9

Preparation of Metal Film Transfer Film

A water-soluble acrylic resin, JONCRYL354J (manufactured by BASF Japan Ltd., aqueous solution having a solid content of 33.5%) was applied onto a 38 µm-thick poly(ethylene terephthalate) (hereinafter to be abbreviated as PET) film by a die coater, the solvent was removed by drying at 120° C. in a hot-air drying oven, whereby a 1 µm water-soluble acrylic resin layer was formed on the PET film. Then, a copper layer (500 nm) was formed on the water-soluble acrylic resin layer by sputtering (E-400S, manufactured by Canon ANELVA Corporation) and a chrome layer (20 nm) was formed on the copper layer, whereby a film for metal film transfer having a 520 nm metal film layer was produced.

Preparation of Adhesive Film with Metal Film.

The adhesive film prepared in Example 7 and the above-mentioned metal film transfer film were laminated at 90° C. such that the curable resin composition layer and the metal film transfer film layer were contacted and wound to give an adhesive film with a metal film.

Formation of Curable Resin Composition Layer on Circuit Board with Adhesive Film with Metal Film.

The copper layer of a glass epoxy substrate with a circuit formed by a 18 µm-thick copper layer was roughened by a treatment with CZ8100 (azole-copper complex, surface treating agent containing organic acid (manufactured by MEC COMPANY LTD.)). The adhesive film was laminated on both surfaces of a circuit board with a batch type vacuum press laminating machine MVLP-500 (trade name, MEIKI CO., LTD.), whereby the curable resin composition layer and the metal film layer were formed on the circuit board. Lamination included reducing the pressure for 30 seconds to set the pressure to 13 hPa or below, and pressing at pressure 7.54 kgf/cm$^2$ for 30 seconds. Then, the curable resin composition layer was cured at 150° C. for 30 minutes, and further at 180° C. for 30 minutes to give an insulating layer (cured product layer). A PET film, which is a support layer, was detached from the insulating layer. The release property was good and the film was easily detached by hand. Thereafter, the water-soluble acrylic resin layer was removed by immersing (with stirring) the layer in 10% aqueous sodium hydroxide solution at 40° C. The metal film layer was uniformly transferred, and abnormalities such as swelling between the resin and the metal film, wrinkles of the metal film and cracks of the metal film were not observed.

Formation of Copper Plating Layer.

A metal film layer was subjected to electric copper plating to form an about 30 µm-thick copper plating layer, whereby a multi-layer printed wiring board was produced.

Example 10

In the same manner as in Example 8 except that the adhesive film prepared in Example 4 was used as an adhesive film, preparation of an adhesive film with a metal film and formation of curable resin composition layer on a circuit board with the adhesive film with a metal film were performed. Then, a metal film was transferred onto the insulating layer in the same manner as in Example 8, and a copper plating layer was formed by electric copper plating, whereby a multi-layer printed wiring board was produced. The release property of the support layer was good and the film was easily detached by hand. The metal film layer was uniformly transferred, and abnormalities such as swelling between the resin and the metal layer, wrinkles of the metal layer and cracks of the metal layer were not observed.

Example 11

In the same manner as in Example 8 except that a metal film layer of the film for metal film transfer (an adhesive film with a metal film) consisted only of a copper layer (500 nm) (no chrome layer), a multi-layer printed wiring board was produced. The release property of the support layer was good and the film was easily detached by hand. The metal film layer was uniformly transferred, and abnormalities such as swelling between resin and metal film, wrinkles of metal film and crack of metal film were not observed.

Example 12

In the same manner as in Example 8 except that a metal film layer of the film for metal film transfer (an adhesive film with a metal film) consisted only of a copper layer (250 nm) (no chrome layer), a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

Example 13

Preparation of Film for Metal Film Transfer

A 1:1 solution of methylethylketone (hereinafter to be abbreviated as MEK) and N,N-dimethylformamide (hereinafter to be abbreviated as DMF) having a hydroxypropyl methylcellulose phthalate ("HP-55" manufactured by Shin-Etsu Chemical Co., Ltd.) solid content of 10% was applied onto a release treated surface of a 38 μm-thick PET film ("AL-5" manufactured by Lintec Corporation) after a release treatment with an alkyd resin mold release agent by a die coater, the solvent was removed by raising the temperature from room temperature to 140° C. at a temperature rise rate of 3° C./second in a hot-air drying oven, whereby a 1 μm hydroxypropyl methylcellulose phthalate layer was formed on the PET film. Then, a copper layer (500 nm) was formed on the hydroxypropyl cellulose phthalate layer by sputtering (E-400S, manufactured by Canon ANELVA Corporation), whereby a film for metal film transfer was produced. Using the metal film transfer film and in the same manner as in Example 1, an adhesive film with a metal film was obtained. Using the adhesive film with a metal film and in the same manner as in Example 1, a multi-layer printed wiring board was produced. The release property of the support layer was good and the film was easily detached by hand. The metal film layer was uniformly transferred, and abnormalities such as swelling between the resin and the metal film, wrinkles of the metal film and cracks of the metal film were not observed.

The property evaluation in the above-mentioned Examples and the following Reference Examples were performed according to the following methods.
Measurement of Peeling Strength of Conductive Layer.

The peeling strength of the conductive layer was measured according to JIS C6481. The conductor thickness was about 30 μm.
Measurement of Insulating Layer Surface Roughness.

The surface roughness of the insulating layer was measured by removing the copper plating layer and metal film layer on the prepared multi-layer printed wiring board with a copper etching solution or, where necessary, a chrome etching solution, and determining Ra value (arithmetic mean roughness) of the surface of an insulating layer by a non-contact surface roughness meter (WYKO NT3300 manufactured by Veeco Instruments inc.) in VSI contact mode using a 50-power lens for the measurement area of 121 μm×92 μm.
State of Metal Film After Curing.

The presence or absence of swelling between resin and metal film, wrinkles of metal film and crack of metal film was visually confirmed. When defect was absent, ○ was recorded, and defect was present, the state thereof was recorded.
Evaluation of Release Property of Support Layer.

The release property of the support layer was evaluated by manually detaching the support layer.

Reference Example 1

An experiment was performed in the same manner as in Example 1 and using a 50 μm-thick thermoplastic fluororesin film (ETFE: ethylene-trifluoroethylene copolymer, "TOYO-FLON" manufactured by TORAY Industries Inc.) as a support layer having a release function. That is, a copper layer (500 nm) was formed on the thermoplastic fluororesin film and a chrome layer (20 nm) was formed on the copper layer by sputtering (E-400S, manufactured by Canon ANELVA Corporation), whereby a film for metal film transfer having a 520 nm metal film layer was prepared. In the same manner as in Example 1, the adhesive film prepared in Example 1 was laminated to give an adhesive film with a metal film, and the adhesive film with a metal film was laminated on the circuit board. Then, the curable resin composition layer was cured at 150° C. for 30 minutes, and further at 180° C. for 30 minutes to give an insulating layer (cured product layer). Observation from above the transparent thermoplastic fluororesin film revealed many wrinkles in the metal film layer. In addition, the thermoplastic fluororesin film layer showed poor release property, and when the layer was detached by hand, the thermoplastic fluororesin film partly remained, resisting detachment from the metal film, and complete detachment was not available.

Reference Example 2

An experiment was performed in the same manner as in Example 1 and using a 20 μm-thick release PET film (manufactured by Reiko Co., Ltd., "FINEPEEL") containing a melamine release resin. That is, a copper layer (500 nm) was formed on the melamine release resin layer and a chrome layer (20 nm) was formed on the copper layer by sputtering (E-400S, manufactured by Canon ANELVA Corporation), whereby a film for metal film transfer having a 520 nm metal film layer was prepared. In the same manner as in Example 1, the adhesive film prepared in Example 1 was laminated on the metal film transfer film to give an adhesive film with a metal film, and the adhesive film with a metal film was laminated on the circuit board. Then, the curable resin composition layer was cured at 150° C. for 30 minutes, and further at 180° C. for 30 minutes to give an insulating layer (cured product layer). Observation from above the transparent PET film revealed no abnormalities such as swelling between the resin and the metal film, wrinkles of the metal film and cracks of the metal film. However, detachment of the PET film was difficult.

Reference Example 3

An experiment was performed in the same manner as in Example 1 and using a 38 μm release PET film (manufactured by TORAY ADVANCED FILM Co., "CERAPEEL HP2") containing an acrylic release resin. That is, a copper layer (500 nm) was formed on the acrylic release resin layer and a chrome layer (20 nm) was formed on the copper layer by sputtering (E-400S, manufactured by Canon ANELVA Corporation), whereby a film for metal film transfer having a 520 nm metal film layer was prepared. In the same manner as in Example 1, the adhesive film prepared in Example 1 was laminated on the metal film transfer film to give an adhesive film with a metal film, and the adhesive film with a metal film was laminated on the circuit board. Then, the curable resin composition layer was cured at 150° C. for 30 minutes, and further at 180° C. for 30 minutes to give an insulating layer (cured product layer). Observation from above the transparent PET film revealed no abnormalities such as swelling between the resin and the metal film, wrinkles of the metal film and cracks of the metal film. However, detachment of the PET film was difficult. The acrylic release resin on the PET film did not dissolve in water or alkaline aqueous solution.

Reference Example 4

A 1:1 solution of ethanol and water having a polyvinyl alcohol (manufactured by KURARAY CO., LTD., "PVA- 203") solid content of 15% was applied onto a PET film by a die coater, the solvent was removed by raising the temperature from room temperature to 140° C. at a temperature rise rate of 3° C./second in a hot-air drying oven, whereby a 1 μm polyvinyl alcohol resin layer was formed on the PET film. Then, an experiment was performed in the same manner as in Example 3. That is, a copper layer (500 nm) was formed on the polyvinyl alcohol resin layer and a chrome layer (20 nm) was formed on the copper layer by sputtering (E-400S, manufactured by Canon ANELVA Corporation), whereby a film for metal film transfer having a 520 nm metal film layer was prepared. In the same manner as in Example 3, the resin varnish prepared in Example 3 was applied to the metal film transfer film to give an adhesive film with a metal film, and the adhesive film with a metal film was laminated on the circuit board. Then, the curable resin composition layer was cured at 150° C. for 30 minutes, and further at 180° C. for 30 minutes to give an insulating layer (cured product layer). Observation from above the transparent PET film revealed no abnormalities such as swelling between the resin and the metal film, wrinkles of the metal film and cracks of the metal film. However, detachment of the PET film was difficult.

The following Tables 1 to 3 show the results of Examples 1 to 13, and Table 4 shows the results of Comparative Examples 1 to 4.

TABLE 1

| | Example 1 | Example 2 | Example 3 | Example 4 | Example 5 | Example 6 |
|---|---|---|---|---|---|---|
| state of metal film after curing | ○ | ○ | ○ | ○ | ○ | ○ |
| release property of support layer | easy | easy | easy | easy | easy | easy |
| surface roughness (Ra) (nm) | 50 | 60 | 30 | 70 | 60 | 50 |
| peeling strength (kgf/cm) | 0.8 | 0.8 | 0.5 | 1.2 | 1.0 | 1.0 |

TABLE 2

| | Example 7 | Example 8 | Example 9 | Example 10 | Example 11 | Example 12 |
|---|---|---|---|---|---|---|
| state of metal film after curing | ○ | ○ | ○ | ○ | ○ | ○ |
| release property of support layer | easy | easy | easy | easy | easy | easy |
| surface roughness (Ra) (nm) | 50 | 50 | 50 | 70 | 60 | 55 |
| peeling strength (kgf/cm) | 0.7 | 0.8 | 0.7 | 1.2 | 0.9 | 0.8 |

TABLE 3

|  | Example 13 |
| --- | --- |
| state of metal film after curing | ○ |
| release property of support layer | easy |
| surface roughness (Ra) (nm) | 50 |
| peeling strength (kgf/cm) | 0.8 |

TABLE 4

|  | Reference Example 1 | Reference Example 2 | Reference Example 3 | Reference Example 4 |
| --- | --- | --- | --- | --- |
| state of metal film after curing | wrinkles | ○ | ○ | ○ |
| release property of support layer | not easy | no good | no good | no good |
| surface roughness (Ra) (nm) | — | — | — | — |
| peeling strength (kgf/cm) | — | — | — | — |

* In Table, "—" means evaluation was omitted since release property of support layer was defective or detaching thereof was difficult.

From Tables 1 to 3, it is clear that according to the method of the present invention using, as a release layer on a support layer, an adhesive film with a metal film, which contains a water-soluble polymer release layer, the transferability of a metal film layer (release property of support layer) is good, and the film state of the transferred metal film layer is good. Moreover, it is clear that since the metal film layer adheres to the insulating layer (cured layer of curable resin composition) with high adhesion strength without roughening the surface thereof, unnecessary portions can be easily removed by etching after circuit formation, and inconveniences such as dissolution of wiring (conductive layer) and the like do not occur easily.

In addition, it is clear from Table 4 that, in the case of the adhesive films with a metal film of Reference Examples 1 to 4 wherein a water-soluble polymer release layer was not used as a release layer on a support layer, the adhesive films are poor in practical use, since a support layer cannot be detached easily, even if it is detached at all, and therefore, the transferred metal film layer easily develops defects such as wrinkles and the like, and a support layer may not be detached in some cases.

INDUSTRIAL APPLICABILITY

Using the adhesive film with a metal film of the present invention, laminate structure of an insulating layer and a metal film layer (metal film layer having uniform property and insulating layer to be its primer) can be integrally formed on a substrate. Therefore, using the adhesive film with a metal film, a metal film layer having high adhesiveness and high uniformity can be formed on a substrate, which enables etching for circuit formation under milder conditions. Therefore, the present invention extremely advantageously acts for microwiring and simplification of steps in the production of circuit boards such as multi-layer printed wiring board, flexible printed wiring board and the like.

This application is based on patent application Nos. 2007-052055, 2007-052060 and 2007-216342 filed in Japan, the contents of which are incorporated in full herein by this reference.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. An adhesive film with a metal film, comprising a water-soluble polymer release layer, a metal film layer, and a curable resin composition layer, which are formed in this order on a support layer, and having a release property enabling detachment of said water-soluble polymer release layer between said support layer and said release layer after curing said curable resin composition layer,
wherein:
said water-soluble release layer comprises at least one water-soluble cellulose resin which is hydroxypropyl methylcellulose phthalate,
said water-soluble cellulose resin has a weight average molecular weight of 20,000 to 60,000, and
said support layer is a poly(ethylene terephthalate) film.

2. The adhesive film with a metal film according to claim 1, wherein said metal film layer has one or more layers comprising at least one metal selected from the group consisting of chrome, nickel, titanium, nickel chrome alloy, aluminum, gold, silver, and copper.

3. The adhesive film with a metal film according to claim 1, wherein said metal film layer comprises copper.

4. The adhesive film with a metal film according to claim 1, wherein said metal film layer comprises a copper layer, and a chrome layer, nickel chrome alloy layer or titanium layer, which are formed in this order on said water-soluble polymer release layer.

5. The adhesive film with a metal film according to claim 1, wherein said metal film layer is formed by vapor deposition, by sputtering, or by vapor deposition and sputtering.

6. The adhesive film with a metal film according to claim 1, wherein said curable resin composition comprises an epoxy resin.

7. The adhesive film with a metal film according to claim 6, wherein said curable resin composition further comprises an inorganic filler.

8. The adhesive film with a metal film according to claim 1, wherein said curable resin composition comprises an epoxy resin, a thermoplastic resin, and a curing agent.

9. The adhesive film with a metal film according to claim 1, wherein said curable resin composition comprises an epoxy resin, a thermoplastic resin, and a cyanate ester resin.

10. The adhesive film with a metal film according to claim 1, wherein said curable resin composition layer is a prepreg of a reinforcement fiber sheet impregnated with a curable resin composition.

11. The adhesive film with a metal film according to claim 1, wherein said support layer has a thickness of 10 μm to 70 μm.

12. The adhesive film with a metal film according to claim 1, wherein said water-soluble polymer release layer has a thickness of 0.1 m to 20 μm.

13. The adhesive film with a metal film according to claim 1, wherein said water-soluble polymer release layer has a thickness of 0.2 μm to 5 μm.

14. The adhesive film with a metal film according to claim 1, wherein said metal film layer has a thickness of 50 nm to 5000 nm.

15. The adhesive film with a metal film according to claim 1, wherein said metal film layer has a thickness of 50 nm to 1000 nm.

16. A method of producing a circuit board, comprising:
   laminating, on a substrate, the adhesive film with a metal film according to claim 1, such that the curable resin composition layer contacts the substrate;
   curing said curable resin composition layer;
   detaching said support layer; and
   removing said water-soluble polymer release layer present on said metal film layer by dissolving said release layer in an aqueous solution.

17. The method according to claim 16, further comprising:
   forming a conductive layer on said metal film layer after said removing said water-soluble polymer release layer present on said metal film layer.

18. A circuit board, which is prepared by a method which comprises laminating, on a substrate, the adhesive film with a metal film according to claim 1, such that the curable resin composition layer contacts the substrate;
   curing said curable resin composition layer;
   detaching said support layer; and
   removing said water-soluble polymer release layer present on said metal film layer by dissolving said release layer in an aqueous solution.

* * * * *

UNITED STATES PATENT AND TRADEMARK OFFICE
CERTIFICATE OF CORRECTION

PATENT NO. : 8,357,443 B2
APPLICATION NO. : 12/551802
DATED : January 22, 2013
INVENTOR(S) : Hirohisa Narahashi et al.

It is certified that error appears in the above-identified patent and that said Letters Patent is hereby corrected as shown below:

In the Claims:

Please amend Claim 12 by replacing 0.1 m with 0.1 µm in Col. 30, line 64.

Signed and Sealed this
Fourth Day of June, 2013

Teresa Stanek Rea
*Acting Director of the United States Patent and Trademark Office*